(12) United States Patent
Mayer et al.

(10) Patent No.: US 6,366,235 B1
(45) Date of Patent: Apr. 2, 2002

(54) RADAR SYSTEM FOR MOTOR VEHICLE

(75) Inventors: Hermann Mayer, Vaihingen; Claus Engelke, Stuttgart, both of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/462,333

(22) PCT Filed: Jun. 30, 1998

(86) PCT No.: PCT/DE98/01792

§ 371 Date: Apr. 5, 2000

§ 102(e) Date: Apr. 5, 2000

(87) PCT Pub. No.: WO99/03002

PCT Pub. Date: Jan. 21, 1999

(30) Foreign Application Priority Data

Jul. 8, 1997 (DE) .......................... 197 29 095

(51) Int. Cl.⁷ .................................. G01S 7/28
(52) U.S. Cl. .......................... 342/70; 342/175
(58) Field of Search ................. 342/70, 71, 72, 342/159, 175, 198

(56) References Cited

U.S. PATENT DOCUMENTS

| | | | | |
|---|---|---|---|---|
| 3,715,677 A | * | 2/1973 | Vergnolle | 330/306 |
| 3,718,869 A | * | 2/1973 | Gerlach | 331/96 |
| 4,445,096 A | | 4/1984 | Lee et al. | 331/107 |
| 4,502,022 A | * | 2/1985 | Stahl et al. | 331/68 |
| 4,543,577 A | | 9/1985 | Tachibana et al. | |
| 4,583,057 A | * | 4/1986 | Fende | 331/107 DP |
| 5,428,326 A | * | 6/1995 | Mizan et al. | 333/219.1 |
| 5,451,970 A | * | 9/1995 | Cole | 343/786 |
| 5,844,527 A | * | 12/1998 | Takashima et al. | 343/781 P |
| 6,037,894 A | * | 3/2000 | Pfizenmaier et al. | 342/70 |

FOREIGN PATENT DOCUMENTS

| | | | | |
|---|---|---|---|---|
| JP | 360177279 A | * | 9/1985 | G01S/7/28 |
| WO | 84/01243 | | 3/1984 | |

* cited by examiner

*Primary Examiner*—John B. Sotomayor
(74) *Attorney, Agent, or Firm*—Kenyon & Kenyon

(57) ABSTRACT

An automotive radar system having an oscillator is described, the oscillator generating a high-frequency signal only in intervals as a function of a control signal during operation of the radar system. The oscillator includes a microwave diode, in particular a Gunn diode or an Impatt diode, accommodated inside a casing-like body. At least one of the following components, an ohmic resistor, a transistor or an IC is arranged so that it is thermally connected to the casing-like body or to an element thermally connected to the latter, the component having at least one additional function in the circuit configuration of the radar system other than generating heat. This guarantees that the oscillator will oscillate reliably even at very low temperatures and in particular in chopping operation.

10 Claims, 2 Drawing Sheets

RADAR SYSTEM FOR MOTOR VEHICLE

FIELD OF THE INVENTION

The present invention relates to an automotive radar system having an oscillator, which generates a high-frequency signal only in intervals during operation of the radar system as a function of a control signal, and a microwave diode, in particular a Gunn diode or an Impatt diode accommodated inside a casing-like body.

BACKGROUND INFORMATION

A generic radar system is described in International Patent Publication No. WO 97/02496, for example. This document describes a monostatic FMCW radar sensor for a motor vehicle for detection of objects, with at least one antenna feed in combination with a dielectric lens being designed for both sending and receiving a suitable echo signal. This generic radar system is described in greater detail below with reference to FIGS. 1 and 2. According to International Patent Publication No. WO 97/02496, the output power of the oscillator can be blanked out to reduce the average energy consumption or, in other words, to reduce the average microwave output power emitted. In this regard, the operating mode of this FMCW radar sensor approximates that of a pulse radar. In a concrete application, the oscillator is blanked out in a clock ratio of 90 milliseconds pause to 10 milliseconds transmission time, for example.

With this radar sensor, oscillator 5 according to FIG. 4 is connected in series to a control transistor 40, forming a voltage divider with it. It is known that the instantaneous oscillation frequency can be influenced within a certain range by operating voltage Uosz on the oscillator, so it is possible to control both the frequency modulation and the blanking out of the oscillator by way of the transistor. There is usually no voltage applied to the oscillator during the blanking out period, and no current flows through the voltage divider accordingly.

Problems occur when the oscillator contains a microwave diode as in the present case. Such oscillators based on semiconductor components have the property of little or no response at very low temperatures, in particular below −20° C., which can easily occur with use in a motor vehicle. This is true in particular because due to the clocked operation, self-heating of the oscillator is not sufficient to guarantee a reliable response at a precise frequency in this case. One possible way to eliminate this disadvantage would be to keep the oscillator in constant operation at such low temperatures. However, this would lead either to greater environmental pollution because of the increased average total output power or to a greater expense to prevent this increased pollution. The oscillation frequency of the oscillator in this operation can also drift so far away that the frequency control circuit is no longer capable of pulling it back into the allowed range. Thus, the oscillator cannot be safely prevented from oscillating outside the narrowly defined allowed range in this type of operation.

Another possibility is to heat the oscillator with the help of a heating resistor at very low temperatures. However, this also requires additional wiring and thus higher costs.

SUMMARY OF THE INVENTION

An object of the present invention is to provide an automotive radar system which guarantees a reliable and secure oscillator response in a simple and inexpensive manner even at very low temperatures and in clocked operation.

This object is achieved according to the present invention by a radar system with which at least one of the components, an ohmic resistor, transistor or IC is arranged so that is in contact with the casing-like body or an element thermally connected to the latter, with this component within the circuit configuration of the radar system having at least one other function in addition to generating heat. optionally, an electrically insulating heat transfer film or paste or a comparable material may be provided for electric insulation between the component and the casing-like body or the element thermally linked to it. This is also included in the formulation given above, because ultimately it is important only that the respective component is thermally linked to the oscillator. The element thermally connected to the casing-like body may be, for example, a hollow conductor extension of the oscillator or a heat sink.

It is especially advantageous if the component is mounted on the casing-like body or the element thermally connected to it.

In a preferred embodiment of the present invention, the component is a transistor which is used as a controlling means for adjusting the size of the control signal of the oscillator.

An advantage of the radar system according to the present invention is that self-heating of the oscillator is increased very inexpensively, because no additional components or circuitry measures are required. In addition, no additional heating energy is necessary, so there is no change in the power consumption of the radar system according to the present invention in comparison with known systems. Nevertheless, a reliable response of the oscillator at an accurate frequency is guaranteed even at very low temperatures on the basis of the present invention. In comparison with continuous operation of the oscillator at very low temperatures, which is also conceivable as an alternative, the average microwave power emitted is reduced significantly.

Furthermore, there is the possibility of heating the oscillator at very low temperatures even when the radar system itself is not yet in operation, e.g. because the driver does not yet need the related function. The oscillator is advantageously heated as soon as the engine is started at very low temperatures, as explained in greater detail below on the basis of the following embodiments. However, start-up of the radar system is allowed only when the minimum required operating temperature of the oscillator has been reached. This lasts only approximately. one to two minutes with the option proposed here.

DETAILED DESCRIPTION

Figure 1:
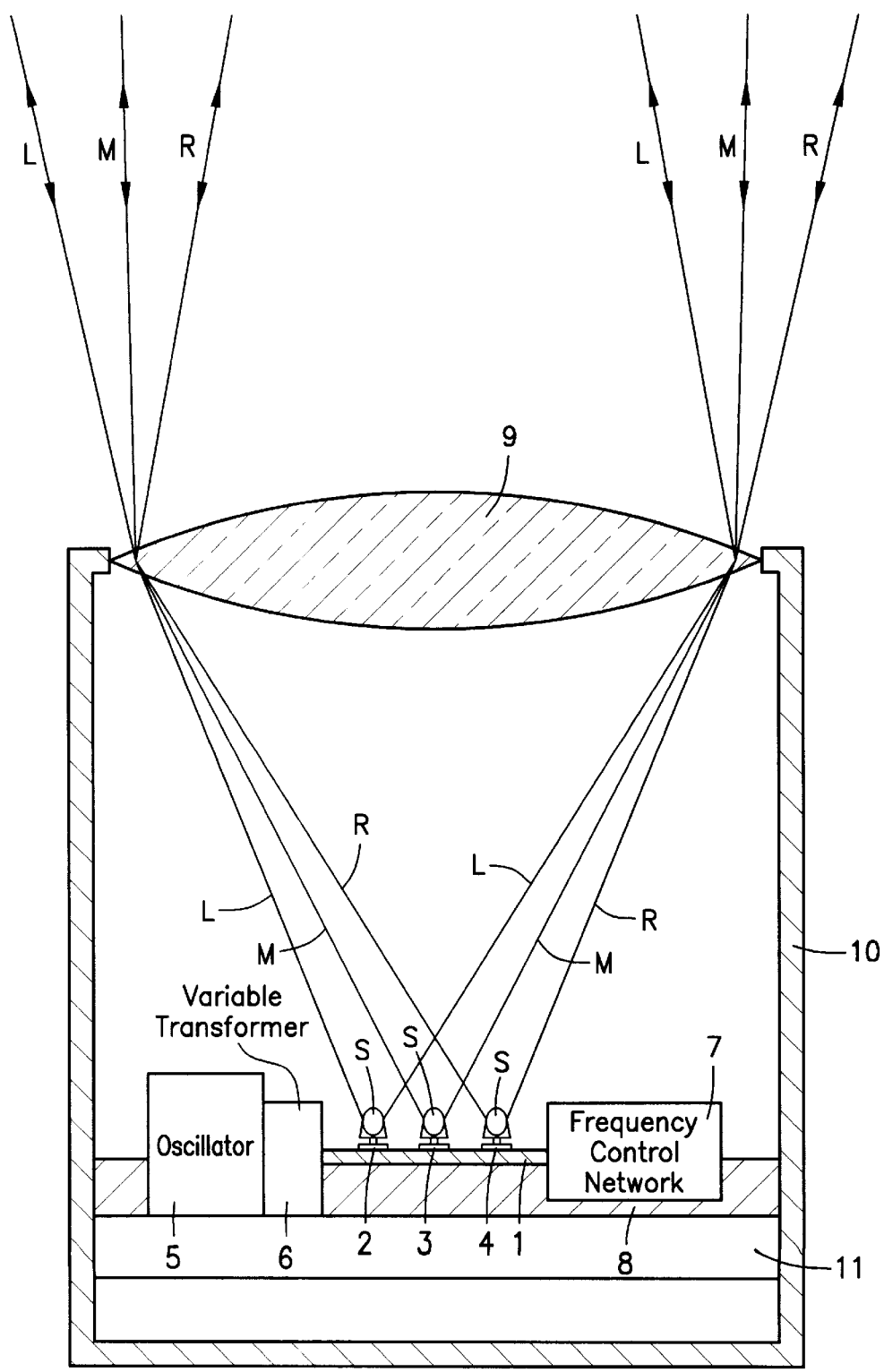
FIG. 1 shows a diagram of the radar system according to the related art.

FIG. 1 shows a diagram of a radar system according to the related art described above. In combination with a dielectric lens 9, three transciever elements 2, 3, 4 arranged on a strip conductor arrangement 1 form three transciever beams L, M, R. Strip conductor arrangement 1 is applied to a substrate 8 which is in turn arranged on a base plate 11. The structure of oscillator 5 is described in greater detail with reference to FIG. 2. A variable transformer 6 is a hollow conductor arrangement having a tapering cross section for overcoupling the microwave energy of oscillator 5 to strip conductor arrangement 1. The instantaneous frequency of oscillator 5 can be adjusted with frequency control network 7. This is necessary because the radar system described here is an FMCW radar. However, the present invention may also be used with a pulse radar independently thereof. The entire circuit configuration of the radar system is accommodated in a casing 10 having a dielectric lens 9 at the front end in the beam direction.

Figure 2:
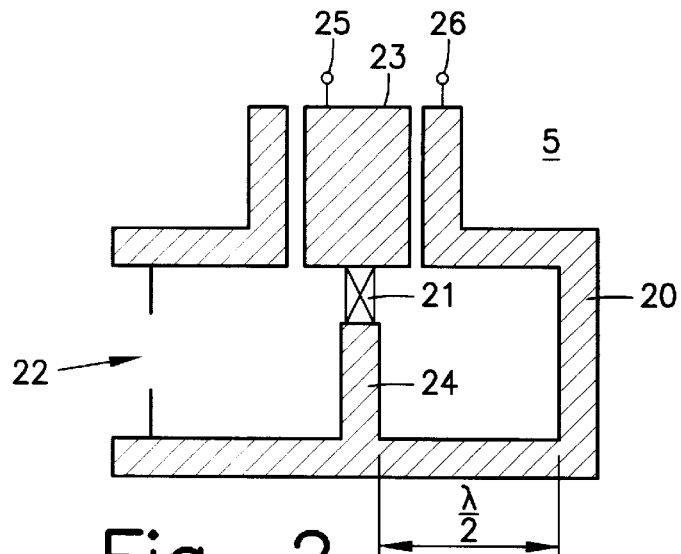
FIG. 2 shows a cross section of a known design of an oscillator having a microwave diode.

FIG. 2 shows a known design of oscillator 5, as described in detail in volume 5 of "Handbuch für Hochfrequenz- und Elektrotechniker" [Handbook for High-Frequency and Electrical Engineers], edited by Curt Rind, Hüthig Verlag, Heidelberg. A microwave diode, preferably a Gunn diode or an Impatt diode 21, is arranged inside a resonant structure 20 there. Resonant structure 20 is a hollow conductor structure whose geometric dimensions determine the resonant frequency of the oscillator. An aperture 22 is provided for tapping the microwave energy generated, which is injected into variable transformer 6 in the present case. As an alternative, however, other known methods of tapping are also conceivable, e.g. magnetic tapping with the help of a conductor loop. Microwave diode 21 sits on a metal post, which is cylindrical in the present case, and is located in the middle of resonant structure 20. At its upper end, microwave diode 21 is in contact with a metal block 23 which serves as a heat sink, because the microwave diode can become very hot at normal ambient temperatures and in continuous operation in particular. Microwave diode 21 can receive an operating voltage over two terminals 25 and 26 on metal block 23 and resonant structure 20. If this operating voltage exceeds a threshold value, the size of which depends on the type of diode used, a high-frequency oscillation is induced in resonant structure 20, its frequency being determined essentially by the geometric dimensions of the arrangement. However, the frequency can be varied within a certain range by varying the power supply voltage. This is advantageously used for frequency modulation with FMCW radar. If the operating voltage is below the above-mentioned threshold value, the induced oscillation subsides again, i.e., oscillator 5 stops oscillating. In chopping operation, the power supply voltage is usually set at zero for blanking out the oscillator.

Figure 3:
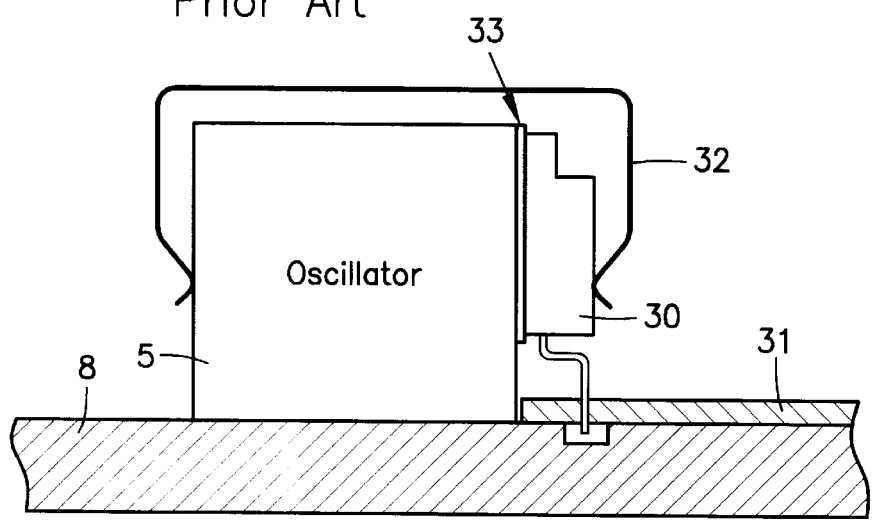
FIG. 3 shows a preferred arrangement of a transistor according to the present invention.

FIG. 3 shows a preferred arrangement of a transistor according to the present invention to supplement the self-heating of oscillator 5. As an alternative, an ohmic resistor, an integrated circuit (IC) or some other component could also be used here instead of the transistor. It is essential here that this is a component having a measurable self-heating sufficient for the stated purpose in operation. Oscillator 5 with its casing-like body on base plate 8 according to FIG. 1 is shown. Printed conductor 31 is in contact with transistor 30, for example. Transistor 30 is in contact with oscillator 5 and is therefore thermally connected to the latter. Under certain circumstances, it is even sufficient for the respective component to be arranged "very close" to oscillator 5 without being in direct contact with it. In the individual case, this will depend on the power loss generated by the component. According to a preferred embodiment, however, transistor 30 is mounted on the casing-like body of oscillator 5. According to FIG. 3, for example, this can be implemented by a spring clamp 32. As an alternative, however, transistor 30 may be bolted to the casing of oscillator 5. For electric insulation between oscillator 5 and transistor 30, an electrically insulating layer 33 is provided here between oscillator 5 and the casing of transistor 30. Such insulating layers in the form of heat transfer films or pastes are sufficiently known in the related art.

Figure 4:
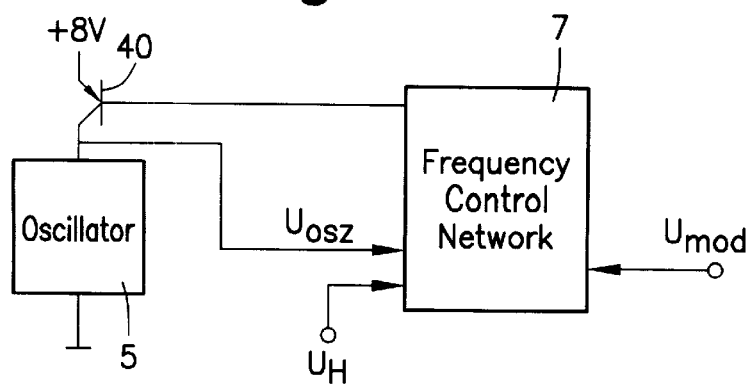
FIG. 4 shows a circuit configuration according to a preferred embodiment of the present invention.

FIG. 4 shows a circuit configuration of an especially preferred embodiment of the present invention. Oscillator 5 and frequency control network 7 from FIG. 1 are shown as schematic blocks. In addition, there is a transistor 40 to whose emitter a voltage of +8 V is applied in this case. The base of the transistor is connected to frequency control network 7. The transistor is connected by its collector to oscillator 5, e.g. at terminal 25 according to FIG. 2. Second terminal 26 is connected to ground in this case. Transistor 40 and oscillator 5 form a voltage divider with respect to the voltage of +8 V. Therefore, operating voltage Uosz on oscillator 5 can be set by frequency control network 7 and transistor 40. Instantaneous operating voltage Uosz is tapped from the collector of transistor 40 in parallel with oscillator 5 and sent to frequency control network 7.

In addition, frequency control network 7 receives at other inputs a first control signal Umod and a second control signal UH. Both are generated by a central control unit of the radar system (not shown). Frequency control network 7 generates as a function of control signal Umod a control voltage which is applied to the base of transistor 40 and thus it determines the operating voltage of oscillator 5 via the base of transistor 40. Since this voltage influences the instantaneous frequency of the oscillator within certain limits, as mentioned above, the frequency of oscillator 5 can be modulated. Second control signal UH is preferably a logic signal which serves as a switchable heating of oscillator 5 according to an especially preferred embodiment of the present invention. As a function of this signal, operating voltage Uosz of the oscillator is not set at zero in the intervals when the oscillator should not generate any oscillation, but instead is set at a value between a first and a second threshold value; exceeding the first threshold value causes current to flow through the voltage divider, and only exceeding the second threshold value causes the oscillator to begin to oscillate. In the case of an oscillator with a Gunn diode, the first threshold value is 0 V, for example, and the second is approximately. 0.8 V.

Due to operating voltage Uosz, which is increased in comparison with the normal case, during the blanking-out intervals of the oscillator, the average current flow through oscillator 5 is increased on the whole, resulting in greater self-heating of oscillator 5. At very low temperatures, however, this is not sufficient to achieve the object discussed above . This can be calculated from the fact that operating voltage Uosz must be below the second threshold value in the intervals when the oscillator is not oscillating. Therefore, most of the voltage (approximately 7 V) on transistor 40 drops and most of the power loss is also converted in it. Due to the arrangement of the transistor according to FIG. 3, however, the transistor is thermally connected to the oscillator and thus additional power loss is supplied to the oscillator for heating. For example, if no additional heating of the oscillator is needed at higher ambient temperatures, the current flow through the voltage divider from transistor 40 and oscillator 5 is completely suppressed as a function of control signal UH during the intervals when the oscillator is blanked out. Therefore, there is no additional heating and the arrangement behaves like the arrangements known in the related art. Accordingly, the combination of arrangements according to FIGS. 3 and 4 described here is especially advantageous in achieving the object according to the present invention.

If the central control unit receives information regarding the instantaneous temperature of the oscillator by using a temperature sensor (not shown), the temperature of the oscillator can be regulated easily and advantageously on the basis of the length of the blanking-out times and the magnitude of the operating voltage during the blanking-out times. Frequency fluctuations of the oscillator which result from a temperature-induced shift in the operating point of the microwave diode are reduced by such temperature regulation.

What is claimed is:

1. An automotive radar system comprising:

an oscillator for generating a high-frequency signal only in intervals as a function of a control signal during an operation of the radar system, the oscillator including a casing-like body and a microwave diode accommodated inside the casing-like body; and a transistor serving as a controlling element to adjust a magnitude of the control signal of the oscillator, the transistor generating heat, the transistor being situated so as to be thermally coupled to the casing-like body.

2. The radar system according to claim 1, wherein the microwave diode is a Gunn diode.

3. The radar system according to claim 1, wherein the microwave diode is an Impatt diode.

4. The radar system according to claim 1, wherein the transistor is directly thermally coupled to the casing-like body.

5. The radar system according to claim 1, wherein the transistor is indirectly thermally coupled to the casing-like body.

6. The radar system according to claim 1, wherein the transistor is in contact with the casing-like body.

7. The radar system according to claim 1, wherein the transistor is in contact with a further element thermally coupled to the casing-like body.

8. The radar system according to claim 1, wherein the transistor is attached to the casing-like body.

9. The radar system according to claim 1, wherein the transistor is coupled in series with the oscillator, the transistor and the oscillator forming a voltage divider, the transistor helping to set an operating voltage of the oscillator at least one value above a first threshold value and below a second threshold value, wherein exceeding the first threshold value causes a current to flow through the voltage divider, and exceeding the second threshold value causes the oscillator to begin to oscillate.

10. The radar system according to claim 9, further comprising means for regulating a temperature of the oscillator by a length of blanking out times and a magnitude of the operating voltage during the blanking out times.

* * * * *